(12) United States Patent
Caillaud et al.

(10) Patent No.: US 10,849,242 B2
(45) Date of Patent: Nov. 24, 2020

(54) TOUCHSCREEN DISPLAY DEVICE COMPRISING A FINGER-HOOK

(71) Applicant: THALES, Courbevoie (FR)

(72) Inventors: Maxime Caillaud, Merignac (FR); Laurent Mozer, Merignac (FR); Yannick Le Roux, Merignac (FR)

(73) Assignee: THALES, Courbevoie (FR)

( * ) Notice: Subject to any disclaimer, the term of this patent is extended or adjusted under 35 U.S.C. 154(b) by 0 days.

(21) Appl. No.: 16/413,560

(22) Filed: May 15, 2019

(65) Prior Publication Data
US 2020/0015373 A1    Jan. 9, 2020

(30) Foreign Application Priority Data

Jul. 5, 2018   (FR) ...................................... 18 00715

(51) Int. Cl.
| | | |
|---|---|---|
| *G06F 1/16* | (2006.01) | |
| *H05K 5/02* | (2006.01) | |
| *B64D 43/00* | (2006.01) | |
| *G06F 3/041* | (2006.01) | |
| *H05K 5/00* | (2006.01) | |
| *B60K 35/00* | (2006.01) | |

(52) U.S. Cl.
CPC ............. *H05K 5/023* (2013.01); *B64D 43/00* (2013.01); *G06F 3/041* (2013.01); *H05K 5/0017* (2013.01); *B60K 35/00* (2013.01)

(58) Field of Classification Search
CPC ..................................................... H06F 3/041
See application file for complete search history.

(56) References Cited

U.S. PATENT DOCUMENTS

| | | | |
|---|---|---|---|
| 9,348,446 B1 | 5/2016 | Barber et al. | |
| 9,870,093 B2 | 1/2018 | Gannon | |
| 2012/0105335 A1 | 5/2012 | Suddreth et al. | |
| 2013/0087442 A1 | 4/2013 | Kellerer et al. | |
| 2014/0153241 A1* | 6/2014 | Templeton | G09F 9/33 362/249.02 |
| 2017/0075442 A1* | 3/2017 | Thomas | G06F 3/039 |

FOREIGN PATENT DOCUMENTS

WO      01/00435 A1    1/2001

OTHER PUBLICATIONS

Cockburn, et al., "Turbulent Touch: Touchscreen Input for Cockpit Displays", CHI '17 Proceedings of the 2017, CHI Conference on Human Factors in Computing Systems, pp. 6742-6753, May 2, 2017.

* cited by examiner

*Primary Examiner* — Jerry Wu
(74) *Attorney, Agent, or Firm* — BakerHostetler

(57) ABSTRACT

A display devices intended to be mounted on an instrument panel are provided. These display devices comprise a front face on which is mounted a touch surface and a bearing face, the front face and the bearing face having rectangular forms of the same dimensions, the touch surface being surrounded by a rigid frame. The frame comprises, on its perimeter, a flange situated in the extension of the front face, the section of this flange in a plane at right angles to the front face being rectangular, the flange topping the front face by a height equal to or greater than 3 millimeters, its depth being equal to or greater than 3 millimeters and the distance separating the internal wall of this flange from the bearing face being equal to or greater than 10 millimeters. This flange can comprise either points of reference or notches.

2 Claims, 4 Drawing Sheets

TOUCHSCREEN DISPLAY DEVICE COMPRISING A FINGER-HOOK

CROSS-REFERENCE TO RELATED APPLICATIONS

This application claims priority to foreign French patent application No. FR 1800715, filed on Jul. 5, 2018, the disclosure of which is incorporated by reference in its entirety.

FIELD OF THE INVENTION

The field of the invention is that of the touchscreens mounted on instrument panels or instrument panels of vehicles. More specifically, the preferred field of the invention is that of air transport and of the touchscreens mounted on the instrument panels of the aircraft.

BACKGROUND

In aeronautics, the instrument panels are increasingly often provided with display screens comprising touch surfaces that make it possible to interact simply and ergonomically with the functions displayed. These touchscreens have to be able to be used in conditions of significant vibrations due, for example, to the atmospheric turbulences or, for military aircraft, to particular maneuvering or combat phases. Other types of vehicles encounter problems of the same kind such as, for example, the all-terrain vehicles which can be subjected to significant vibrations or accelerations. These conditions felt by the user partly hamper his or her capacity to interact accurately with the touchscreen, possibly resulting in involuntary interactions with the screen.

FIG. 1 illustrates this problem. It represents a display device 1 comprising, on its front face 2, a touch surface 3. It is mounted on an instrument panel 4. When the latter is subjected, for example, to vibrations, the hand of the user U has no grip on the touch screen and the accuracy of the gesture is greatly degraded. The effects of the disturbances are all the more significant when the screen is located at a certain distance from the user, requiring him or her to extend the arm to be able to perform the action, which further increases the inaccuracy of the gesture.

This problem is recent. In the past, the control and interaction means were essentially control stations comprising physical knobs such as push buttons or rotary knobs which allowed for a correct grasp by the user before undertaking the action. The introduction of display devices has made it possible to considerably reduce the number of items of equipment in a cockpit, and thus reduce the weight and the bulk and improve the ergonomics of the presentation of information. These display devices were initially controlled by graphical pointing devices of the "computer mouse" or "CCD" (acronym for "Cursor Control Device") type. These pointing devices offer the same advantages as the control stations. The hand can easily be stabilized, for example, on a "palm-rest" and the graphic pointer can be positioned correctly on the display screen.

The replacement of the graphic pointing devices with touch surfaces has several advantages. It makes it possible to have a direct and rapid interaction with, for example, a displayed menu. It opens the way to new functions performed, for example, by coordinated movements of a finger or of several fingers, such as the "zoom" functions. Nevertheless, the direct interaction on a screen reduces the possibility of stabilization that is offered by a traditional physical means such as a control knob or a pointing device and can generate muscle fatigue, given the distance from the user to the screen.

To resolve this problem, various technical solutions have been proposed. The U.S. Pat. No. 9,348,446 entitled "Bezel for vehicular touchscreen displays" proposes adding, on the sides of the screen, a dished and removable palm rest produced in two different materials. This solution seeks to prioritize adhesion so as to stabilize the palm of the hand of the user.

The U.S. Pat. No. 9,870,093 entitled "System and method for improving touch screen display use under vibration and turbulence" describes a display screen comprising a surround made of flexible elastomer that, here again, make it possible to facilitate grip and adhesion.

The application US 2017/0 075 442 entitled "Touch screen bezel design for use in aviation operations" describes a display screen comprising a surround whose bearing surfaces include protuberances that make it possible to increase adhesion.

Finally, the application US 2012/0 105 335 entitled "Touch screen display assembly" describes a display screen comprising, once again, a surround comprising bearing surfaces whose materials and forms have been worked so as to increase the adhesion thereof.

All these technical solutions present a certain number of drawbacks. They rely essentially on increasing adhesion when the palm or the fingers of the user are in contact with the perimeter of the screen. This increase is obtained either by acting on the materials, or by modifying the forms of the bearing surfaces, or by adding protuberances of various forms on the bearing surfaces. This adhesion can prove insufficient when turbulences are significant or when the user is wearing gloves. The bearing surfaces, to be effective, necessarily have significant dimensions and can thus conceal other instruments. Moreover, the industrialization of certain bearing surfaces composed of hybrid materials can prove complex to implement and costly. The soft materials can degrade over time, thus losing some of their effectiveness. Finally, these technical solutions do not make it possible to easily identify the position of the hand blind, making any prepositioning difficult.

SUMMARY OF THE INVENTION

The display device according to the invention does not present the above drawbacks. It is simple, inexpensive, easy to implement and effective. The device according to the invention comprises a touch surface whose frame comprises, on its perimeter, a rigid flange used as "finger-hook". It has been tested successfully in experimental conditions. It has in particular been demonstrated that the stability, during turbulences, is better if the user can hook the fingers on the screen so that the hand is under tension. In this case, the tension is exerted by the index finger accompanied by the middle finger and the ring finger, the thumb ensuring the action on the touch tablet. The simple exercising of a pressure on the edge of the screen does not ensure the same level of stability. Thus, the most ergonomic forms of the finger-hooks have been able to be determined.

Moreover, the industrialization of the finger-hooks according to the invention is easy to implement in as much as the parts are simple to machine. Furthermore, it is easy to modify an existing display frame by the addition of the finger-hooks according to the invention.

More specifically, the subject of the invention is a display device intended to be mounted on an instrument panel, said display device comprising a front face on which is mounted a touch surface and a bearing face bearing on the instrument panel, the front face and the bearing face having rectangular forms, the touch surface being surrounded by a rigid frame, wherein this frame comprises, on its perimeter, a flange situated in the extension of the front face, the section of this flange in a plane at right angles to the front face being rectangular, the flange topping the front face by a height equal to or greater than 3 millimeters, its depth being equal to or greater than 3 millimeters and the distance separating the internal wall of this flange from the bearing face being equal to or greater than 10 millimeters.

Advantageously, the frame comprises at least one point of reference arranged between the internal wall of the flange and the bearing face, said point of reference having a substantially parallelepipedal form, its height being that of the flange, its depth being equal to the distance separating the internal wall of the flange from the bearing face, its width being equal to or greater than 5 millimeters.

Advantageously, the frame comprises a plurality of points of reference arranged on at least one side of the perimeter of the frame, said points of reference being separated by a constant distance.

Advantageously, the frame comprises a plurality of points of reference arranged on at least one side of the perimeter of the frame, said points of reference being separated by a variable distance.

The invention relates also to a display device intended to be mounted on an instrument panel, said display device comprising a front face on which is mounted a touch surface and a bearing face bearing on the instrument panel, the front face and the bearing face having rectangular forms of the same dimensions, the touch surface being surrounded by a rigid frame, wherein this frame comprises, on its perimeter, a flange situated in the extension of the front face, the section of this flange in a plane at right angles to the front face being rectangular, the flange topping the front face by a height equal to or greater than 3 millimeters, its depth being equal to the distance separating the internal wall of this flange from the bearing face, said flange comprising at least one notch having a substantially parallelepipedal form, its depth being equal to or greater than 3 millimeters, its length being equal to the distance separating the internal wall of the flange from the bearing face, its width being equal to or greater than 5 millimeters.

Advantageously, the frame comprises a plurality of notches arranged on at least one side of the perimeter of the frame, said notches being separated by a constant distance.

Advantageously, the frame comprises a plurality of notches arranged on at least one side of the perimeter of the frame, said notches being separated by a variable distance.

BRIEF DESCRIPTION OF THE DRAWINGS

The invention will be better understood and other advantages will become apparent on reading the following description that is given in a nonlimiting manner and from the attached figures in which.

DETAILED DESCRIPTION

Figure 1:
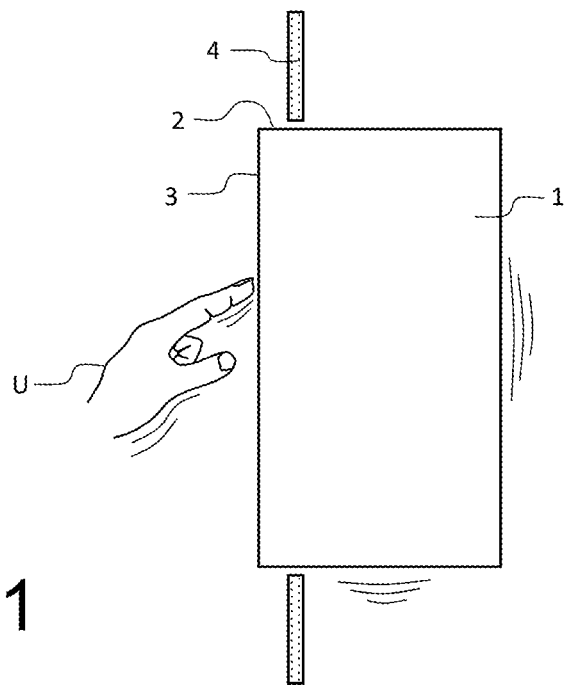
FIG. 1, previously described, represents a touch surface frame according to the prior art.
Figure 2:
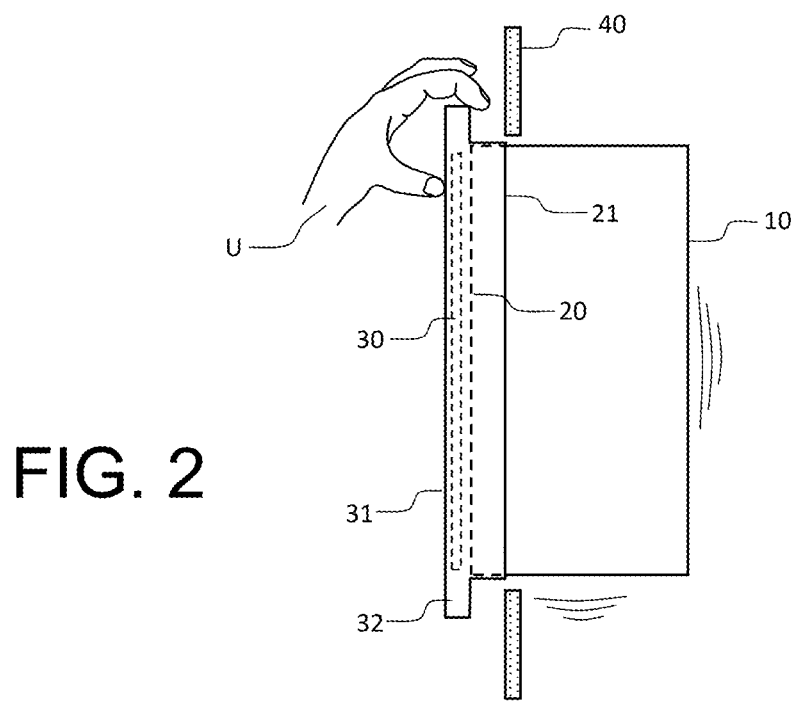
FIG. 2 represents a general view of a first embodiment of a touch surface frame according to the invention.

As an example, FIG. 2 represents a general view of a first embodiment of a display device comprising a touch surface frame according to the invention. Hereinbelow, the display devices are mounted on aircraft instrument panels. However, the "finger-hook" system according to the invention can be mounted on all types of land or sea-going vehicles likely to be subjected to significant accelerations or vibrations.

The display device 10 comprises a front face 20 on which is mounted a touch surface 30. The device according to the invention can be adapted to all types of display device and of touch surface. The display device comprises a bearing face 21 bearing on the instrument panel 40, the front face 20 and the bearing face 21 having rectangular forms. The bearing face can comprise means for fixing the display device onto the instrument panel which are known to the person skilled in the art.

Figure 3:
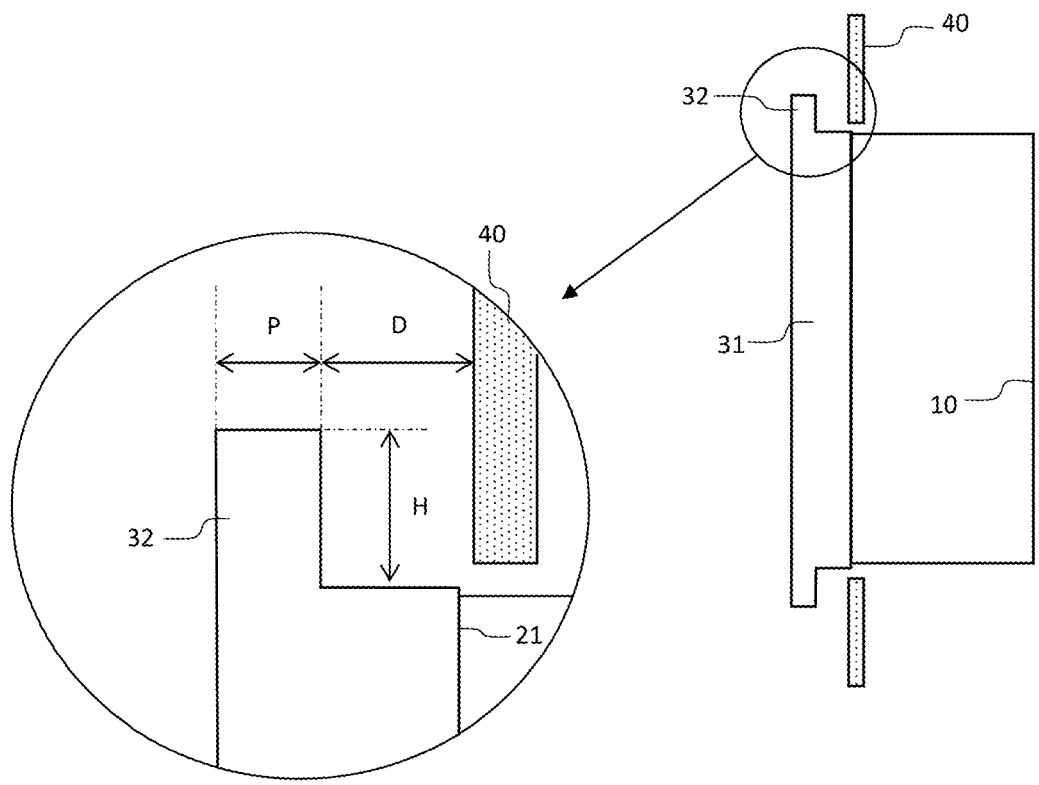
FIG. 3 represents an enlarged partial cross-sectional view of the frame of FIG. 2.

The touch surface 30 is surrounded by a rigid frame 31. This frame is generally metallic. This frame 31 comprises, on its perimeter, a flange 32 situated in the extension of the front face. FIG. 3 represents an enlarged partial cross-sectional view of the flange of FIG. 2. The section of this flange 32 in a plane at right angles to the front face is substantially rectangular, the flange topping the front face by a height H of a few millimeters. More specifically, this height is equal to or greater than 3 millimeters. Its depth P is also a few millimeters. More specifically, its depth is equal to or greater than 3 millimeters. The distance D separating the internal wall of this flange from the bearing face is equal to or greater than 10 millimeters.

These parameters result from an optimum between the smallest possible footprint and weight while preserving the function of stabilization of the hand around the display screen.

When the user U wants to use the touch surface, he or she can hook his or her fingers onto the flange which offers him or her a sufficient grip as can be seen in FIG. 2. The tensile force on the flange is both more effective and less tiring than a bearing force. The user can thus use the touch surface more safely and more effectively.

Figure 4:
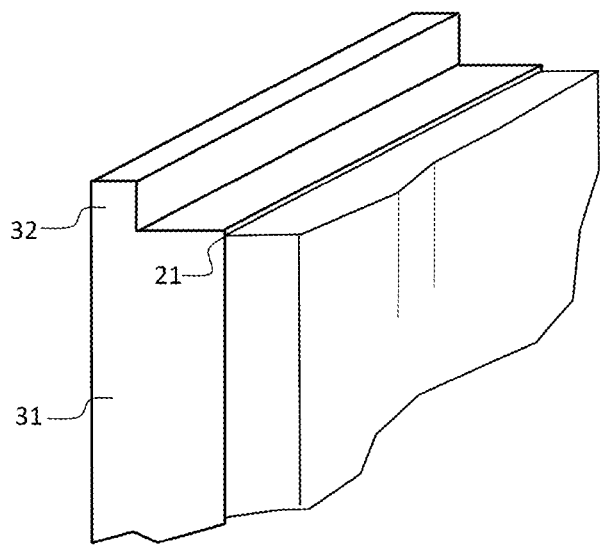
FIG. 4 represents an enlarged partial perspective view of the frame of FIG. 2.

FIG. 4 represents an enlarged partial perspective view of the frame 31 and of the flange 32 of FIGS. 2 and 3.

Figure 5:
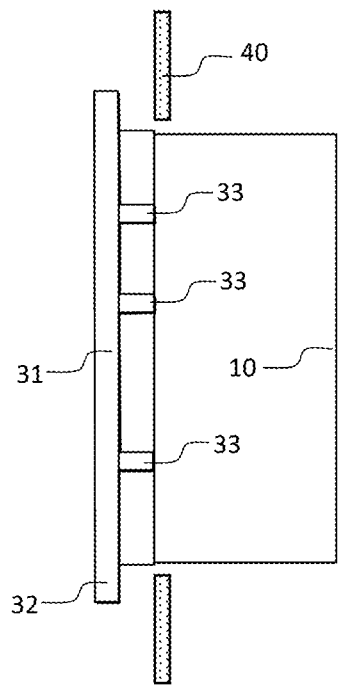
FIG. 5 represents a general view of a variant embodiment of the touch surface frame of FIG. 2.

FIG. 5 represents a general view of a variant embodiment of the touch surface frame of FIG. 2. In this variant, the frame 31 comprises one or more points of reference 33 arranged between the internal wall of the flange 32 and the bearing face 21, each point of reference 33 having a substantially parallelepipedal form, its height being that of the flange, its depth being equal to the distance separating the internal wall of the flange from the bearing face, its width being equal to or greater than 5 millimeters.

Figure 6:
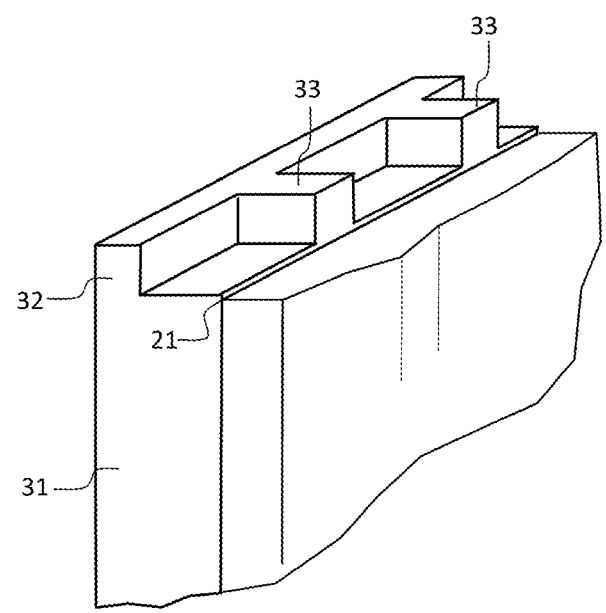
FIG. 6 represents an enlarged partial perspective view of the frame of FIG. 5.

These points of reference have a dual use. They make it possible to better ensure the grip of the fingers of the user. Particularly on the lateral parts of the screen, the points of reference offer a good vertical stabilization and make it possible to counter the effects of gravity, thus preventing the hand from slipping to the bottom of the screen. They also make it possible to be easily registered on the touch surface. They can be separated by a constant distance so as, for example, to divide the screen edge into zones of equal dimensions. It is also possible to place them at predefined positions corresponding to particular functions addressed by the touch surface. These points of reference can be all identical or of different form so they can be better identified. In FIGS. 5 and 6, the points of reference are of parallelepipedal form but other forms are possible. Certain parts can be rounded to facilitate the grip. Generally, any change of form or of dimensions of these points of reference remains within the scope of the display device according to the invention.

FIG. 6 represents an enlarged partial perspective view of the frame 31, of the flange 32 and of the points of reference 33 of FIG. 5.

Figure 7:
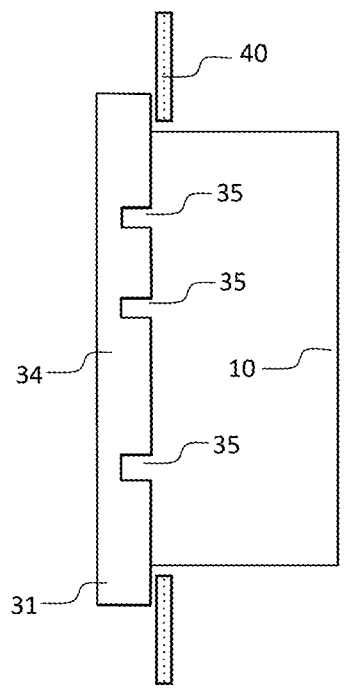
FIG. 7 represents a general view of a second embodiment of a touch surface frame according to the invention.

FIG. 7 represents a second embodiment of the flange of the preceding figures. In this embodiment, the frame 31 comprises, on its perimeter, a flange 34 situated in the extension of the front face, the section of this flange in a plane at right angles to the front face being rectangular, the flange topping the front face by a height equal to or greater than 3 millimeters, its depth being equal to the distance separating the internal wall of this flange from the bearing face. The flange 34 comprises notches 35 having a substantially parallelepipedal form. The depth of the notch is a few millimeters and, preferentially, it is equal to or greater than 3 millimeters, its length being equal to the distance separating the internal wall of the flange from the bearing face, its width is a few millimeters and, preferentially, this width is equal to or greater than 5 millimeters.

Figure 8:
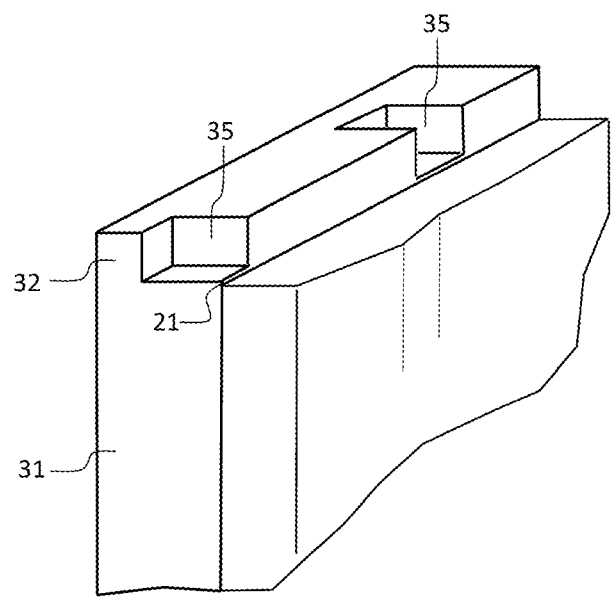
FIG. 8 represents an enlarged partial perspective view of the frame of FIG. 7.

FIG. 8 represents an enlarged partial perspective view of the frame 31, of the flange 32 and of the notches 35 of FIG. 7.

Here again, these notches have a dual use. They make it possible to better ensure the grip of the fingers of the user. In particular on the lateral parts of the screen, the notches offer a good vertical stabilization and make it possible to counter the effects of gravity, thus preventing the hand from slipping to the bottom of the screen. They also make it possible to be registered easily on the touch surface. Thus, they can be separated by a constant distance so as, for example, to divide the screen edge into zones of equal dimensions. They can also be placed at predefined positions corresponding to particular functions addressed by the touch surface. These notches can be all identical or of different form so they can be better identified. In FIGS. 7 and 8, the notches are of parallelepipedal form but other forms are possible. Some parts can be rounded to facilitate the grip. Generally, any change of form or of dimensions of these notches remains within the scope of the display device according to the invention.

The main advantages of the "finger-hooks" according to the invention are that they are simple to machine, require only simple changes of the form of the frame and are practically wear-free. Moreover, they introduce very little in the way of visual masking in as much as a flange of a few millimeters is sufficient to ensure a correct grip by the user.

Furthermore, in a system comprising several similar display screens, the form of the finger-hooks does not depend on the position of the screen. It is possible to perform a screen replacement in the event of failure. The production costs are thus limited.

A final advantage is that this finger-hook solution allows for a freedom of movement of the hand along the display device, while retaining the stabilization that is sought.

The invention claimed is:

1. A display device configured to be mounted on an instrument panel, said display device comprising:
    a front face on which is mounted a touch surface and a bearing face bearing on the instrument panel, the front face and the bearing face having rectangular forms, the touch surface being surrounded by a rigid frame and the front face having an extension; and
    the rigid frame comprises a perimeter having a flange situated in the extension of the front face, a section of the flange in a plane at right angles to the front face being rectangular, and the flange having an internal wall that is configured to form a location that a user hooks their fingers to behind the internal wall of the rigid frame with a tensile force while using the touch surface,
    wherein the flange extends from a top of the front face by a height equal to or greater than 3 millimeters, the flange having a depth being equal to or greater than 3 millimeters, and a distance separating the internal wall of the flange from the bearing face being equal to or greater than 10 millimeters;
    wherein the rigid frame comprises a plurality points of reference arranged between the internal wall of the flange and the bearing face, said the plurality points of reference having a substantially parallelepipedal form, a height of each of said plurality points of reference being that of the flange, a depth of each of said plurality points of reference being equal to a distance separating the internal wall of the flange from the bearing face, a width of said plurality points of reference being equal to or greater than 5 millimeters; and
    wherein said plurality of points of reference being separated by a variable distance.

2. A display device configured to be mounted on an instrument panel, said display device comprising:
    a front face on which is mounted a touch surface and a bearing face bearing on the instrument panel, the front face and the bearing face having rectangular forms of the same dimensions and the front face having an extension,
    the touch surface being surrounded by a rigid frame and the rigid frame comprises a perimeter having a flange situated in the extension of the front face, a section of the flange in a plane at right angles to the front face being rectangular and forms an internal wall,
    the flange topping the front face by a height equal to or greater than 3 millimeters, the flange having a depth being equal to a distance separating an internal wall of this flange from the bearing face, and
    said flange comprising at least one notch having a substantially parallelepipedal form, the at least one notch having a depth being equal to or greater than 3 millimeters, the at least one notch having a length being equal to a distance separating the internal wall of the flange from the bearing face, and the at least one notch having a width being equal to or greater than 5 millimeters,
    wherein the flange is configured to form a location that a user hooks their fingers to between the internal wall of the rigid frame and the bearing face with a tensile force while using the touch surface;
    wherein the rigid frame comprises a plurality points of reference arranged between the internal wall of the flange and the bearing face, said the plurality points of reference having a substantially parallelepipedal form, a height of each of said plurality points of reference being that of the flange, a depth of each of said plurality points of reference being equal to a distance separating the internal wall of the flange from the bearing face, a width of said plurality points of reference being equal to or greater than 5 millimeters; and wherein said plurality of points of reference being separated by a variable distance.

* * * * *